United States Patent [19]

Wada et al.

[11] 4,292,393
[45] Sep. 29, 1981

[54] PHOTOSENSITIVE IMAGE FORMING MATERIALS

[75] Inventors: Minoru Wada; Fumiaki Shinozaki; Yohnosuke Takahashi; Satoshi Yoshida, all of Asaka; Tomoaki Ikeda, Shizuoka, all of Japan

[73] Assignee: Fuji Photo Film Co., Ltd., Minami-ashigara, Japan

[21] Appl. No.: 177,963

[22] Filed: Aug. 14, 1980

[30] Foreign Application Priority Data

Aug. 14, 1979 [JP] Japan .................................. 54-103373

[51] Int. Cl.³ ................................................ G03C 1/94
[52] U.S. Cl. ..................................... 430/275; 430/25; 430/278; 430/313; 430/323
[58] Field of Search ................ 430/25, 275, 278, 313, 430/323

[56] References Cited

U.S. PATENT DOCUMENTS 3,762,325 10/1973 Hallman et al. ..................... 430/323
4,205,989 6/1980 Moriya et al. ....................... 430/306

Primary Examiner—Jack P. Brammer
Attorney, Agent, or Firm—Sughrue, Mion, Zinn, Macpeak and Seas

[57] ABSTRACT

A photosensitive image forming material which comprises a photosensitive resin composition layer on a base and an image forming layer composed of a mixture of a metal and a sulfide between said base and said photosensitive resin composition layer.

3 Claims, 4 Drawing Figures

PHOTOSENSITIVE IMAGE FORMING MATERIALS

BACKGROUND OF THE INVENTION

1. Field of the Invention

The present invention provides photosensitive image forming materials obtainable at low cost which have various excellent properties such as high light-blocking property, high resolving power and stability with the passage of time, whereby image forming processing is shortened. Particularly, the invention relates to photosensitive image forming materials capable of providing black images without a metallic luster.

2. Description of the Prior Art

An image forming process involving using a photosensitive image forming material comprising a photosensitive resin composition layer on a base and various thin metal layers between the base and the photosensitive resin composition layer which comprises imagewise exposing the photosensitive resin composition layer to light, developing and thereafter etching the thin metal layers is known.

Further, an image forming process using a photosensitive image forming material comprising a photosensitive resin composition layer on a base and a thin metal layer (such as aluminum or tellurium) between the base and the photosensitive resin composition layer which comprises imagewise exposing to light, and developing and etching in one bath using an aqueous alkaline solution to shorten processing is described in Japanese patent application (OPI) Nos. 65927/73 (the term "OPI" as used herein refers to a "published unexamined Japanese patent application"), 65928/73, 139720/75 (U.S. Pat. No. 4,008,084), 131625/76 (British Pat. No. 1,514,420), 99811/77, 99814/77, 99102/77, 109926/77 (British Pat. Nos. 1,546,739) and 99810/77 (U.S. Pat. No. 4,139,391).

These prior art processes yield excellent images having high light-blocking property, high resolving power and good edge sharpness, but have the faults that the images produced do not have strong black coloration, rather have a metallic luster similar to a mirror surface and are difficult to view as compared to silver images formed from silver halide sensitive materials. Paticularly in the case that a half tone image is formed and used as a mask in the graphic art field the fault is encountered that the degree of gradation is difficult to estimate. On the other hand, blackening of the image forming layer yields the effect that the resulting black layer acts as an antihalation layer in the case of imagewise exposing the photosensitive resin composition layer to light to further improve resolving power.

SUMMARY OF THE INVENTION

As a result of research on processes for forming black images based on the above prior art, the inventors reached the present invention which involves using non-metallic image forming materials which comprise a photosensitive resin composition layer on a base and an image forming layer comprising a mixture of one or more metals and one or more sulfides between said base and said photosensitive resin composition layer.

DETAILED DESCRIPTION OF THE INVENTION

As the base used in the present invention, conventional base materials as known in the art by, for example, U.S. Pat. No. 4,008,084, can be used, e.g., polyesters such as polyethylene terephthalate, polycarbonates, etc., cellulose acetate, glass and various kinds of paper, etc. The thickness of the base is in the range of 50 $\mu$m to 2 mm, preferably 80 $\mu$m to 1 mm.

To provide the image forming layer comprising a mixture of a metal and a sulfide on the base, it is possible to utilize various processes, for example, vacuum evaporation, sputtering and ion plating, etc. The thickness of the image forming layer is preferably in the range of 40 to 500 nm, particularly 50 to 300 nm.

The molar ratio of sulfide to metal is preferably in the range of the sulfide/metal 1/20 to $\frac{1}{2}$, particularly 1/10 to 3/10.

Figure 1:
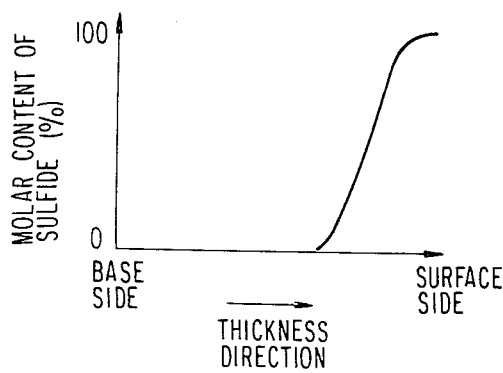
FIGS. 1, 2 and 3 show the molar ratio of sulfide content in the thickness direction of image forming layers in the present invention.
Figure 2:
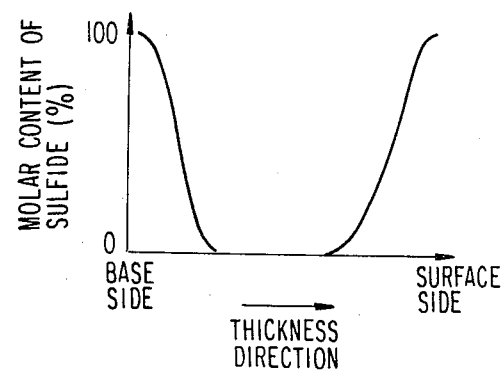
Figure 3:
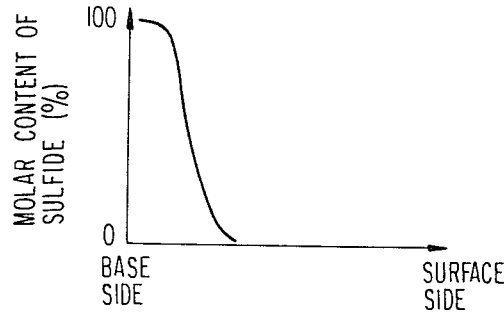

The sulfide/metal layer can be blackened by homogeneously blending the sulfide and the metal. However, to further increase blackness, it is possible to blacken only the surface of the layer by increasing the quantity of the sulfide at the surface of the layer as shown in FIG. 1, to blacken only the side of the layer closest the base as shown in FIG. 3 or to blacken both sides as shown in FIG. 2. That is to say, control of blackening can be optionally made by applying the conventional technique, e.g., one described in Japanese patent application (OPI) No. 99814/77.

As metals which can be blended with the sulfide, though various metals can be used, aluminum and tin are particularly preferred because of their ready availability, lack of toxicity and low price.

As sulfides, though various sulfides can be used, $SnS_x$ ($1 \leq x \leq 2$) and $GeS_y$ ($1 \leq y \leq 3$) are particularly preferred for the same reason as advanced above.

The photosensitive resin composition layer applied to the above-described image forming layer can be formed using various known photosensitive resin compositions for resist formation (referred to as a photosensitive resin, hereinafter). The thickness of the photosensitive resin composition layer is in the range of 1 to 30 $\mu$m, preferably 1.5 to 10 $\mu$m.

The photosensitive resin can be freely selected from known compounds and compositions such as monomers, prepolymers and polymers where the molecular structure thereof chemically changes in a short period of time (e.g., $\frac{1}{2}$ second to 2 minutes, preferably 2 seconds to 60 seconds) to result in a variation of physical properties between exposed and unexposed areas, e.g., in solubility to solvents, in tackiness, etc., when subjected to imagewise irradiation.

The above-described monomers or prepolymers as photosensitive resins are described in, for example, "Kogyogijutsu Library 33: Photosensitive Resins" written by Tatsuo Warashina et al and published by Nikkan Kogyo Shinbunsha, Feb. 21, 1972.

Photosensitive resins can be divided into various classes dependant on the criteria selected, e.g.:

based on the development method—into the dissolution type and the stripping type based on whether development is using a liquid medium (solvent) or by dry stripping (peel apart) development;

based on the type of image formed—into positive working and negative working types;

based on the type of chemical change upon exposure—into ones which undergo a cross-linking reaction due to the presence of metal ions, ones which dimerize when subjected to irradiation, ones which undergo cross-linking initiated by a decomposition product of a photo-destructible substance coexistent therewith and ones which per se undergo polymerization when subjected to irradiation.

Any of the above types of photosensitive resins may be used for preparing the photosensitive image forming materials of the present invention and not only is it contemplated that the many known materials can be used but photosensitive resins capable of forming a photosensitive resist layer developed in the future can also be applied to the photosensitive image forming materials of the present invention in the same manner as in the case of such known materials, irrespective of their classification.

In the case of photosensitive resins for producing a solvent dissolution type layer, a positive working type is one which decomposes upon exposure to light (as shown by, for example, the quinonediazides) to form a 5-membered ring compound with a carboxyl group which then is soluble in an alkali solution, whereby the resin layer in exposed areas can be removed by development with an alkali solution and the resin layer in unexposed areas remains as the desired image whereas a negative working type is one which becomes insoluble due to the formation of a macromolecular or network structure in areas exposed to light, e.g., photocross-linking of cinnamoyl groups or diazonium groups, etc., or photopolymerization of acrylamide or acrylic acid esters, etc., whereby unexposed areas of the photosensitive resin layer are removed using a suitable developing solution and the insoluble exposed areas remain to yield the desired image. Suitable examples of the developing solution include those including alkalis as described in, for example, U.S. Pat. No. 4,098,712, those including phosphorus acid, phosphoric acid or phosphorus acid and phosphoric acid as described in, for example, U.S. Pat. No. 4,124,516, and the like.

Solvent dissolution type photosensitive resins are in general use as a photosensitive materials for PS plates, wipe-on plates, photo-etching resists, etc.

As exemplary positive working type photosensitive resins, 1,2-naphthoquinonediazides can be used. Examples include 2,3,4-trioxybenzophenone-bis(naphthoquinone-1,2-diazido-5,5-sulfonic acid ester) as described in Japanese Patent Publication No. 18015/62, 2-(naphthoquinone-1,2-diazido-5-sulfonyloxy)hydroxy-7-naphthalene as described in Japanese Patent Publication No. 3627/62, naphthoquinone-1,2-diazido-5-sulfoanilide as described in Japanese Patent Publication No. 1954/62 and naphthoquinone-1,2-diazido-5-sulfonic acid novolak esters as described in Japanese Patent Publication No. 9610/70, etc.

As exemplary negative working type photosensitive resins, many photosensitive materials such as diazonium salts, azide compounds and cinnamoyl group-containing compounds, etc., are known and these are useful herein.

Examples of diazonium salts useful as negative working type photosensitive resin include paraformaldehyde condensates of p-(phenylamino)benzenediazonium, and those described in U.S. Pat. No. 1,762,033 such as 4-dimethylaminobenzenediazonium hydrofluoroborate, 3-methyl-4-(dimethylamino)benzenediazonium sulfate and 3-ethylnaphthalenediazonium.

Examples of azide compounds include p-phenylenebisazide, p-azidobenzophenone, 4,4′-diazidobenzophenone, 4,4′-diazidodiphenyl methane, 4,4′-diazidostilbene, 4,4′-diazidochalcone, 2,6-di(4′-azidobenzal)cyclohexanone and 2,6-di(4′-azidobenzal)-4-methylcyclohexanone, etc., as described in U.S. Pat. Nos. 2,852,379 and 2,940,853. These azide compounds are generally used as a "rubber photosensitive solution" by mixing the same with a rubber solution where the rubber can be a natural or synthetic rubber. In the case of synthetic rubbers, polyisoprene is often used, as described in Japanese Patent Publication No. 22084/70 (U.S. Pat. No. 3,488,194).

Examples of the polymers having azide groups in their molecule useful herein include polyvinyl azidobenzoate, polyvinyl azidophthalate, polyvinyl azidobenzalacetal, etc., as described in Japanese Patent Publication Nos. 28499/65 and 22085/70 (U.S. Pat. No. 3,475,176).

Examples of photosensitive resins comprising cinnamoyl groups useful as photosensitive resins herein include polyvinyl cinnamate and cinnamylideneacetic acid esters of polyvinyl alcohol such as polyvinyl cinnamylideneacetate, polyvinyl cinnamate cinnamylideneacetate, polyvinyl carboethoxymethylcarbamate cinnamylideneacetate and polyvinyl acetate cinnamylidene acetate.

In addition, a lot of known materials, such as those having acryloyl groups, those using acrylamides and those using acrylates, can also be used as the photosensitive resin.

The above photosensitive resins can be liquid or solid. In the case of using a liquid resin, the resin is applied to the image forming layer which has been previously provided on the base, followed by drying in the customary manner. In the case of using a solid resin such is generally molded into film form and the film is put on the image forming layer and adhered thereto using pressure with, if necessary, heating. If desired, the solid resin can be dissolved in an organic solvent to prepare a solution which is then applied to the image forming layer. In order to form the photosensitive resin layer, processes hitherto known can be utilized. For example, in one such process a high-speed revolving coater called a "whirler" is used whereby application is carried out by revolving the object to be coated at a high rate, and such is preferred for use in case of forming a very thin layer of the photosensitive resin.

In order to form an image using the photosensitive image forming material of the present invention produced as above-described, a mask having the desired image is used as an original and the photosensitive image forming material is imagewise exposed to light to form a latent image corresponding to the above-described image and the photosensitive resin layer is then developed to remove soluble areas of the resin layer by dissolution in the customary manner. The exposure to light is generally carried out by irradiation with near ultraviolet light (wavelength: 290 to 500 nm) or electron beams. The areas of the image forming layer where the resist is no longer present (corresponding to exposed areas) are then removed by dissolution, whereafter the photosensitive resin layer remaining as the resist is removed.

In such an image forming process, the photosensitive layer of the image forming material is exposed to light through the negative or positive original in the dark as in the case of conventional photographic processing. Since many photosensitive resins have high sensitivity to ultraviolet, it is preferred to use light sources having a high proportion of ultraviolet, such as superhigh pressure mercury lamps, xenon lamps, carbon arc lamps, chemical lamps, etc. Yellow lamps can be used as safety lamps.

As indicated, a latent image is formed in the photosensitive resin layer by the imagewise exposure. In the case that the photosensitive resin is soluble in solvents, the latent image provides a difference in solubility between exposed areas and unexposed areas of the photosensitive resin layer, namely, in the case of a positive working type resin, the photosensitive resin in unexposed areas remains as it is (insoluble) but exposed areas become soluble in the solvent while in the case of a negative working type resin the photosensitive resin in unexposed areas retains its property of dissolving in the solvent but in exposed areas becomes insoluble by hardening.

Examples of solvents used include water, aqueous alkali solutions which may contain organic solvents, and organic solvents per se. Examples of organic solvents which can be used include ketones such as methyl ethyl ketone, cellosolves such as methyl cellosolve acetate, ethyl cellosolve acetate and phenyl cellosolve acetate, and alcohols such as benzyl alcohol, but it is not construed to be limited to these specific examples.

Generally, exposed areas of positive working type resins become soluble in alkalis and exposed areas of negative working type resins become insoluble in water or organic solvents. Accordingly, development of the latent image is carried out by contacting the surface bearing the latent image with a solvent which dissolves either exposed areas or unexposed areas. Of course, in the case of using a photosensitive resin available in the marketplace a developing solution designated by the manufacturer may be used.

In any case, the photosensitive resin layer remains in unexposed areas in the case of a positive working type resin and hardened photosensitive resin layer remains at exposed areas in the case of a negative working type resin, thereby to respectively yield an image, while the image forming layer is exposed at unexposed areas where the photosensitive resin has been removed by dissolution.

The exposing image forming layer is then etched by contact with an etching solution for the image forming layer, e.g., by immersion therein, whereby the image forming layer is removed to expose the base. On the other hand, the residual photosensitive resin layer serves as a resist for the etching and the image forming layer below the resin layer remains without being etched to yield an image having an optical density which depends upon the thickness of the image forming layer.

As etching solutions for the image forming layer, there are alkali solutions and acid solutions, both of which can be used. Since among the above-described photosensitive resins there are photosensitive resins which can be developed with alkalis after imagewise exposure, in the case of using such a photosensitive resin it is possible to carry out one-step processing, i.e., a one bath development-etching whereby the image forming layer is etched simultaneously with forming a resist pattern by development of the photosensitive resin layer after image-wise exposure.

As developing solutions for carrying out such a one bath development-etching of the photosensitive image forming materials, it is possible to use alkali agents such as sodium hydroxide, potassium hydroxide, sodium tertiary phosphate, potassium tertiary phosphate, sodium carbonate, potassium carbonate, sodium silicate, potassium silicate, etc. The alkalinity is generally pH 10 to 14, preferably 11 to 13.5.

It is of course possible to add oxidants such as alkali metal salts of bromic acid or iodic acid to the developing solution to improve the developing property, as described in Japanese patent application (OPI) No. 99101/77 (U.S. Pat. No. 4,098,712). Further, in an etching solution using for a two bath developing which comprises etching the image forming layer after development of the photosensitive resin layer, it is possible to utilize conventional additives such as hydrochloric acid, sulfuric acid, phosphoric acid, phosphorous acid or oxidants such as iron chloride in addition to the above-described alkali agents.

The following Examples illustrate the present invention.

EXAMPLE 1

Aluminum and tin sulfide (SnS) were applied to a polyethylene terephthalate base 100 μm thick by vacuum evaporation at $5 \times 10^{-5}$ Torr so as to have a distribution in the thickness direction as shown in FIG. 1. The image forming layer composed of a mixture of aluminum and tin sulfide (SnS) was formed using an evaporation source for the metal (aluminum) and an evaporation source for the tin sulfide (SnS) and controlling the temperature thereof so as to each attach simultaneously to the base at the desired evaporation rate. The thickness of the image forming layer was 120 nm so as to provide a transmission optical density of at least 3.0. The ratio of metal (aluminum) and sulfide (SnS) in the image forming layer was 5:1 on a molar basis. The following photosensitive resin was applied to the resulted image forming layer by a whirler so as to have a dry film thickness of about 1.5 μm and dried for 2 minutes at 100° C.

| | | |
|---|---|---|
| Copolymer of methyl methacrylate and methacrylic acid (methacrylic acid/ methyl methacrylate molar ratio: 25/75) | 1 | g |
| Pentaerythritol tetraacrylate | 0.85 | g |
| N-Methyl-2-benzoylmethylene-β-naphthothiazole | 0.06 | g |
| Methyl ethyl ketone | 12 | g |
| Methyl cellosolve acetate | 12 | g |

Figure 4:
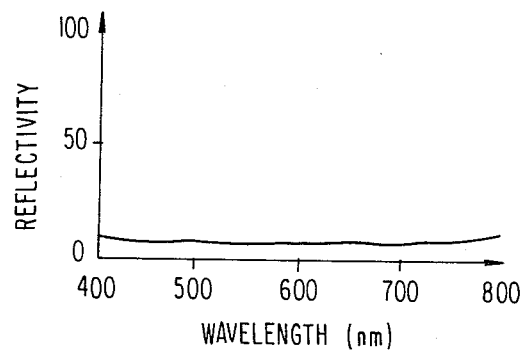
FIG. 4 shows the spectral reflectivity of a photosensitive image forming material of the present invention.

The spectral reflectivity of the photosensitive resin composition layer of the resultant photosensitive image forming material was as shown in FIG. 4; and the photosensitive resin composition layer had a black color.

The resultant photosensitive image forming material was imagewise exposed to light for 40 seconds through a half tone original using a 2 kw metal halide lamp (1 m distance) and then dipped for 30 seconds in a solution having the following composition at 31° C.

| | |
|---|---|
| NaOH | 4 g |
| KBrO₃ | 10 g |
| Water | 1 l |

The optical density of the resultant image was greater than 3.0 and the blackness of the image part was similar to that before development; the resolving power was more than 100 line pairs/mm.

EXAMPLE 2

An image forming layer was obtained by the same manner as in Example 1 except that tin was used as the metal; the mixture in layer form was formed so as to have a distribution in the thickness direction as shown in FIG. 2. The following photosensitive composition was applied to the resultant image forming layer by a whirler to have a dry film thickness of about 1.5 μm and dried for 2 minutes at 100° C.

| | |
|---|---|
| 1,2-Naphthoquinonediazido-5-sulfonic acid ester of polyhydroxyphenyl obtained by polycondensation of acetone and pyrogallol described in Japanese Patent Publication No. 28403/68 (U.S. Pat. No. 3,635,709) | 1 g |
| Phenol resin (produced by Sumitomo Duretz Co., trade name: PR-5094, degree of polymerization: 3 to 10) | 2 g |
| Methyl ethyl ketone | 18 g |
| Methyl cellosolve acetate | 18 g |

The spectral reflectivities of the photosensitive resin composition layer and the base of the resultant photosensitive image forming material were as shown in FIG. 4; both of which had a black color.

The resultant photosensitive image forming material was imagewise exposed to light in the same manner as in Example 1 and then dipped for 30 seconds in a solution having the following composition at 31° C.

| | |
|---|---|
| NaOH | 4 g |
| KIO₃ | 20 g |
| Water | 1 l |

The optical density of the resultant image was more than 3.0 and the blackness of the image area was similar to that before development; the resolving power was more than 100 line pairs/mm.

EXAMPLE 3

A photosensitive image forming material was produced in the same manner as in Example 1 except that germanium sulfide (GeS) was used as the sulfide and the layer was formed so as to have a distribution in the thickness direction as shown in FIG. 3. The spectral reflectivity of the base of the resultant film was as shown in FIG. 4 and the base had a black color.

The resultant photosensitive image forming material was imagewise exposed to light in the same manner as in Example 1 and developed.

The optical density of the resultant image was greater than 3.0 and the blackness of the image area was similar to that before development; the resolving power was more than 100 line pairs/mm.

EXAMPLE 4

A photosensitive image forming material was produced in the same manner as in Example 1 except that paper laminated with polyethylene 10 μm thick was used as the base and $GeS_2$ was used as the sulfide. The spectral reflectivity of the resultant film was as shown in FIG. 4, and the photosensitive resin composition layer had a black color.

The resultant photosensitive image forming material was imagewise exposed to light and developed in the same manner as in Example 1. The blackness of the resultant image areas was similar to that before development; the resolving power was more than 100 line pairs/mm.

EXAMPLE 5

A photosensitive image forming material was produced in the same manner as in Example 1 except that $SnS_{1.5}$ was used as the sulfide. The spectral reflectivity of the film was as shown in FIG. 4, and the photosensitive resin composition layer had a black color. The resultant photosensitive material was imagewise exposed to light and developed in the same manner as in Example 2.

The optical density of the resultant image was more than 3.0, the blackness of the image area was similar to that before development and the resolving power was more than 100 line pairs/mm.

While the invention has been described in detail and with reference to specific embodiments thereof, it will be apparent to one skilled in the art that various changes and modifications can be made therein without departing from the spirit and scope thereof.

What is claimed is:

1. A photosensitive image forming material which comprises a photosensitive resin composition layer on a support and an image forming layer comprising a mixture of a metal and a metal sulfide between said support and said photosensitive resin composition layer, wherein the molar ratio of said metal to said metal sulfide is in the range of 20:1 to 2:1.

2. The photosensitive image forming material as described in claim 1, wherein said metal is aluminum or tin.

3. The photosensitive image forming material as described in claim 1, wherein said metal sulfide is $SnS_x$ ($1 \leq x \leq 2$) or $GeS_y$ ($1 \leq y \leq 3$).

* * * * *